United States Patent [19]

Wrathall et al.

[11] Patent Number: 4,701,883
[45] Date of Patent: Oct. 20, 1987

[54] ECL/CMOS MEMORY CELL WITH SEPARATE READ AND WRITE BIT LINES

[75] Inventors: Robert S. Wrathall, Tempe; Kevin L. McLaughlin, Chandler, both of Ariz.

[73] Assignee: Motorola Inc., Schaumburg, Ill.

[21] Appl. No.: 875,909

[22] Filed: Jun. 19, 1986

[51] Int. Cl.4 .............................................. G11C 11/40
[52] U.S. Cl. .................................. 365/154; 365/156; 365/175
[58] Field of Search ............... 365/174, 175, 154, 156, 365/189

[56] References Cited

U.S. PATENT DOCUMENTS 4,630,238 12/1986 Arakawa ............................ 365/189

*Primary Examiner*—Terrell W. Fears
*Attorney, Agent, or Firm*—Dale E. Jepsen

[57] ABSTRACT

A CMOS memory cell is provided having separate read and write bit lines and coupling devices associated therewith which provide improved read and write times for the cell. The separate read line is coupled to the cell via a bipolar transistor which supplies increased drive current to the read bit line thereby decreasing the read time. The separate write line is coupled to the cell via a low impedance diode which reduces the write time.

17 Claims, 2 Drawing Figures

— PRIOR ART —

4,701,883

ECL/CMOS MEMORY CELL WITH SEPARATE READ AND WRITE BIT LINES

BACKGROUND OF THE INVENTION

The present invention relates in general to the field of memories. More particularly, the present invention relates to a CMOS memory cell having improved read and write speed as a result of having separate read and write bit lines.

The basic CMOS cross coupled latch, which is well known in the art, forms a basic static storage element. In such a device both the reading and writing of the cell have in the past been accomplished by a single bit line coupled to the cell. This single bit line is ordinarily coupled to a number of separate cells and therefore represents a fairly high capacitive load. The read time would therefore be relatively long in that the memory cell itself would be relied upon to transfer current to the high capacitive load bit line. The CMOS memory cell does not ordinarily provide a high current which could charge the capacitive load of the bit line rapidly.

In addition the coupling device used to couple the bit line to the memory cell during the write cycle has ordinarily been a relatively high impedance device such as an N-channel MOS transistor. This relatively high impedance coupling device tends to limit the write cycle time to a relatively high value. Both the read and write time have therefore been relatively high for those coupling devices previously used between the single bit line and a CMOS cross coupled latch memory cell.

SUMMARY OF THE INVENTION

It is therefore an object of the present invention to provide a CMOS memory cell having improved read and write cycle times. It is further an object of the present invention to provide an improved CMOS memory cell having separate read and write cycle bit lines.

It is still further an object of the present invention to provide an improved CMOS memory cell with relatively low impedance coupling devices between the memory cell and the separate read and write bit lines.

The foregoing and other objects are achieved in the present invention wherein there is provided an improved CMOS memory cell having reduced read and write cycle times. The cell comprises first, second, third and fourth transistors, each having a control terminal and first and second load terminals. The first load terminals of the first and second transistors are coupled together for coupling to a first word line terminal. The first load terminals of the third and fourth transistors are coupled together for coupling to a second word line terminal. The second load terminals of the first and third transistors are coupled to the control terminals of the second and fourth transistors. The second load terminals of the second and fourth transistors are coupled to the control terminals of the first and third transistors and to the base terminal of a fifth transistor having emitter, base and collector terminals. The collector terminal of the fifth transistor is coupled to a source of supply voltage and the emitter of the fifth transistor is coupled to a first bit line. In addition a first diode has its anode connected to the base terminal of the fifth transistor and its cathode coupled to a second bit line. The base of a sixth transistor having emitter, base and collector terminals is coupled to the second load terminal of the first transistor. The collector of the sixth transistor is coupled to the supply voltage and the emitter is coupled to a complemented first bit line. A second diode has its anode connected to the base terminal of the sixth transistor and its cathode coupled to a complemented second bit line. In operation the fifth and sixth transistors provide increased current drive to the first bit line and complemented first bit line, respectively. The first and second diodes enable rapid writing of the cell via the second bit line and complemented second bit line, respectively.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompany drawings, wherein.

DESCRIPTION OF A PREFERRED EMBODIMENT

Figure 1:
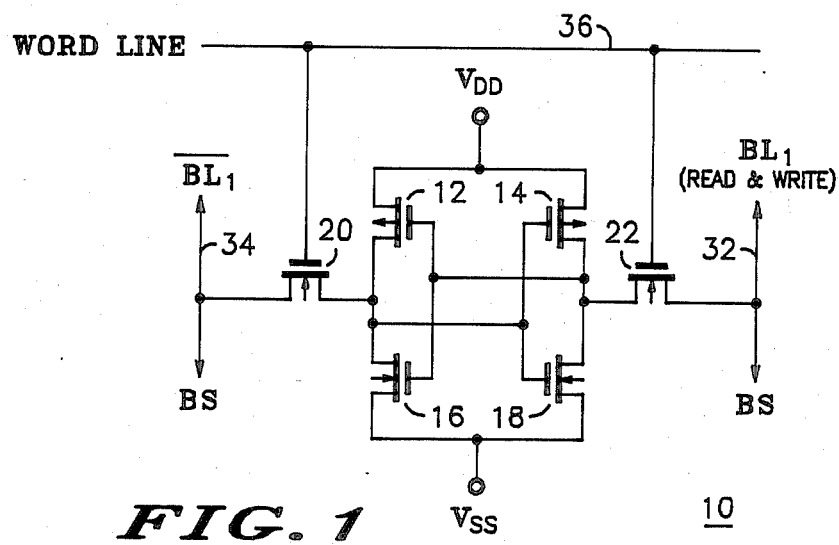
FIG. 1 is schematic diagram of a conventional CMOS memory cell.

With reference to FIG. 1 there is shown a CMOS cross coupled latch which forms the basic static storage element for a memory device. The memory cell itself comprises CMOS transistors 12, 14, 16 and 18. In operation the cell is normally in one of two stable states with either the gates of transistors 12 and 16 at a logic high and the gates of transistors 14 and 18 at a logic low or vice-versa. This prior art memory cell is both read and written via bit lines 32 and 34. During either a read or write cycle a voltage is applied to word line 36 thereby turning on transistors 20 and 22 and coupling the cell to bit lines 32 and 34. The true output is read on bit line 32 and the complemented output is read on bit line 34. Since bit line 32 is a relatively long conductor which is coupled to many other cells it represents a relatively high capacitance and therefore a relatively long time is required for the CMOS cell itself to charge this capacitance and transfer the logic signal or voltage corresponding thereto to bit line 32.

While there are other prior art methods of coupling the bit line to a CMOS memory cell, virtually all of them require the memory cell itself to charge the relatively high capacitance of the single bit line. During the write cycle a voltage is applied to word line 36 again turning on transistors 20 and 22. The logic information contained on bit lines 32 and 34 is then transferred to the memory cell itself via transistors 20 and 22. N-channel CMOS transistors 20 and 22, which are commonly used to couple the CMOS memory cell to the bit lines, present a relatively high impedance during this write cycle and therefore cause a relatively slow write cycle time.

Figure 2:
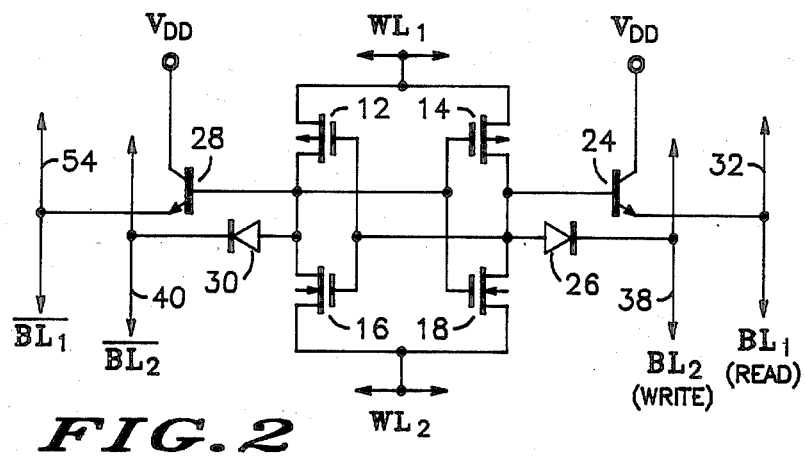
FIG. 2 is a schematic diagram of a CMOS memory cell in accordance with the present invention including the separate read and write bit lines and coupling devices used in conjunction therewith.

Referring now to FIG. 2. there is shown a CMOS memory cell with separate read and write bit lines and devices used to couple said bit lines to the memory cell. CMOS transistors 12, 14, 16 and 18 are coupled as in a standard cross coupled latch. The source terminals of transistors 12 and 14 are coupled together for coupling to a first word line terminal. The gate terminals of transistors 12 and 16 are coupled together and to the drain terminals of transistors 14 and 18. The gate terminals of 14 and 18 are coupled together and to the drain terminals of transistors 12 and 16. The source terminals of transistors 16 and 18 are coupled together for coupling to a second word line terminal. The base terminal of transistor 24 is coupled to the drain terminal of transistor 14. The collector terminal of transistor 24 is coupled to a source of supply voltage and the emitter terminal of transistor 24 is coupled to a first bit line 32. The anode terminal of diode 26 is coupled to the drain terminal of transistor 14 and the cathode terminal of diode 26 is coupled to a second bit line 38. The base terminal transistor 28 is coupled to the drain terminal of transistor 12 and to the anode terminal of diode 30, the cathode of which is coupled to a complemented second bit line 40. The collector of transistor 28 is coupled to the source of supply voltage and the emitter of transistor 28 is coupled to a complemented first bit line 34.

The basic memory cell comprising transistors 12, 14, 16 and 18, as with the prior art memory cell, will be in one of two steady state latched conditions with either the gates of transistors 12 and 16 at a high logic state and the gates of transistors 14 and 18 in a low logic state or vice-versa. During the read cycle, however, a large drive current is provided through transistor 24 to charge the capacitance of bit line 32. Since the charge current being supplied by transistor 24 is approximately beta times the base current being supplied directly from the memory cell, the charge time would be reduced by approximately a factor of beta, substantially reducing the read time of the memory cell.

During the write cycle the separate write bit line 38 is coupled to the memory cell via diode 26 which represents a very low impedance coupling between the bit line and the cell, substantially reducing the voltage swing on bit line 38 necessary to write the cell. This configuration improves the write time over prior art CMOS memory cells by allowing a large forcing current to be introduced into the latch to switch states. Diode 26 may be implemented as an emitter base diode or may be implemented as a Schottky diode. Also, transistor 24 and diode 26 may be merged with the drains of MOSFETS 14 and 18 respectively. In a similar fashion transistor 28 is used to couple complemented bit line 34 to the memory cell and diode 30 is used to couple complemented bit line 40 to the memory cell.

What has been provided therefore is a memory cell configuration which gives substantially ECL speeds on read and write cycles while keeping the standby power in the array to that of a CMOS memory. In addition, the memory cell of the present invention would be compatible with ECL sense amplifiers.

While the present invention has been described above in conjunction with specific apparatus, it is to be clearly understood that this description is made only by way of example and not as a limitation to the scope of the invention.

We claim:

1. A memory cell comprising: first, second, third and fourth transistors each having a control terminal and first and second load terminals, said first load terminals of said first and second transistors coupled together for connection to a first word line terminals, said first load terminals of said third and fourth transistors coupled together for connection to a second word line terminal;
   a fifth transistor having a control terminal and first and second load terminals, said first load terminal of said fifth transistor coupled to a source of supply voltage and said second load terminal of said fifth transistor for coupling to a first bit line;
   a first diode having anode and cathode terminals, said anode terminal coupled to the control terminals of said first, third and fifth transistors and to said second load terminals of said second and fourth transistors, said cathode terminal of said first diode for coupling to a second bit line;
   a sixth transistor having a control terminal and first and second load terminals, said first load terminal of said sixth transistor coupled to said source of supply voltage and said second load terminal of said sixth transistor coupled to a complemented first bit line; and
   a second diode having anode and cathode terminals, said anode terminal coupled to the control terminals of said second, fourth and sixth transistors and to said second load terminals of said first and third transistors, said cathode terminal of said second diode coupled to a complemented second bit line.

2. The memory cell of claim 1 wherein said first, second, third and fourth transistors are CMOS transistors.

3. The memory cell of claim 1 wherein said fifth and sixth transistors are bipolar transistors.

4. The memory cell of claim 2 wherein said fifth and sixth transistors are bipolar transistors.

5. The memory cell of claim 4 wherein said fifth and sixth transistors are NPN transistors.

6. The memory cell of claim 2 wherein said first, second, third, fourth and fifth transistors and said first and second diodes are contained in an integrated circuit.

7. The memory cell of claim 2 wherein said control terminals of said first, second, third and fourth transistors are gate terminals and said first and second load terminals of said first, second third and fourth transistors are source and drain terminals, respectively.

8. The memory cell of claim 1 wherein said first and second diodes are emitter base diodes.

9. The memory cell of claim 1 wherein said first and second diodes are Schottky diodes.

10. The memory cell of claim 6 wherein said fifth and sixth transistors are respectively merged with the second load terminals of said second and first transistors.

11. The memory cell of claim 6 wherein said first and second diodes, are respectively merged with said second load terminals of said fourth and third transistors.

12. In a memory cell comprising: first, second third and fourth transistors, each having a control terminal and first and second load terminals, said first load terminals of said first and second transistors coupled together for connection to a first word line terminal, said first load terminals of said third and fourth transistors coupled together for connection to a second word line terminal, said control terminals of said first and third transistors coupled together and coupled to said second load terminals of said second and fourth transistors for coupling to a first bit line, and said control terminals of said second and fourth transistors coupled together and to said second load terminals of said first and third transistors for coupling to a complemented first bit line, the improvement comprising:
   a fifth transistor having a control terminal and first and second load terminals, said first load terminal of said fifth transistor coupled to a source of supply voltage and said load terminal of said fifth transistor for coupling to said first bit line;
   a first diode having anode and cathode terminals, said anode terminal coupled to said control terminals of said first, third and fifth transistors and to said second load terminals of said second and fourth transistors, said cathode terminal of said first diode for coupling to a second bit line;

a sixth transistor having a control terminal and first and second load terminals, said first load terminal of said sixth transistor coupled to said source of supply voltage and said second load terminal of said sixth transistor coupled to said complemented first bit line; and a second diode having anode and cathode terminals, said anode terminal coupled to the control terminals of said second, fourth and sixth transistors and to said second load terminals of said first and third transistors, said cathode terminal of said second diode coupled to a complemented second bit line.

13. The memory cell of claim 12 wherein said first, second, third and fourth transistors are CMOS transistors.

14. The memory cell of claim 13 wherein said fifth and sixth transistors are bipolar transistors.

15. The memory cell of claim 14 wherein said first, second, third, fourth, fifth and sixth transistors and said first and second diodes are contained in an integrated circuit.

16. The circuit of claim 15 wherein said fifth and sixth transistors are respectively merged into the second load terminals of said second and first transistors.

17. The circuit of claim 16 wherein said first and second diodes are respectively merged into the second load terminals of said fourth and third transistors.

* * * * *